United States Patent
Letavic et al.

(10) Patent No.: US 7,439,585 B2
(45) Date of Patent: Oct. 21, 2008

(54) SILICON-ON-INSULATOR DEVICE

(75) Inventors: Theodore Letavic, Putnam Valley, NY (US); John Petruzzello, Carmel, NY (US)

(73) Assignee: NXP B.V., Eindhoven (NL)

( * ) Notice: Subject to any disclaimer, the term of this patent is extended or adjusted under 35 U.S.C. 154(b) by 294 days.

(21) Appl. No.: 10/560,067

(22) PCT Filed: Jun. 8, 2004

(86) PCT No.: PCT/IB2004/001849

§ 371 (c)(1),
(2), (4) Date: Dec. 7, 2005

(87) PCT Pub. No.: WO2004/109809

PCT Pub. Date: Dec. 16, 2004

(65) Prior Publication Data

US 2006/0163654 A1    Jul. 27, 2006

Related U.S. Application Data

(60) Provisional application No. 60/477,544, filed on Jun. 11, 2003.

(51) Int. Cl.
*H01L 23/62* (2006.01)

(52) U.S. Cl. .................... 257/347; 257/349
(58) Field of Classification Search .......... 257/347, 257/349, 350, 352
See application file for complete search history.

(56) References Cited

U.S. PATENT DOCUMENTS 5,381,818 A * 1/1995 Nendzig et al. ........... 137/242
6,404,015 B2 * 6/2002 Emmerik et al. .......... 257/348

OTHER PUBLICATIONS

Apel U et al: "A 100-V Lateral DMOS Transistor With a 0.3-Micrometer Channel in a 1-Micrometer Silicon-Film-on-Insulator-on-Silicon" IEEE Transactions on Electron Devices, vol. 38, No. 7, Jul. 1991.

* cited by examiner

*Primary Examiner*—Roy K Potter
(74) *Attorney, Agent, or Firm*—Peter Zawilski

(57) ABSTRACT

A Silicon on Insulator (SOI) device is disclosed wherein an extension of P-type doping (303) is implanted between the buried oxide layer of the device and the SOI layer. The extension is of a size and shape to permit the source (309) to be biased at a voltage significantly less than the handler wafer (304) and drain, a condition under which prior art SOI devices may not properly operate.

19 Claims, 4 Drawing Sheets

SILICON-ON-INSULATOR DEVICE

CROSS REFERENCE TO RELATED APPLICATION

This application claims the benefit of U.S. provisional application Ser. No. 60/477,544 filed 11 Jun. 2003, which is incorporated herein whole by reference.

TECHNICAL FIELD

This invention relates to Silicon On Insulator (SOI) devices, and more particularly, to an SOI device suitable for use in a bias condition wherein the substrate layer, sometimes called the "wafer handler" layer, is maintained at a potential in between that of the source and drain regions.

BACKGROUND OF THE INVENTION

FIG. 1 shows a cross section of a typical prior art high voltage Silicon On Insulator (SOI) device. The device 100 in FIG. 1 includes the typical components and regions thereof, such as the source 101, drain 103 and gate region 102. The buried oxide layer 104 forms a junction with the SOI layer 105, both disposed above the substrate layer 106. Such devices are, in many applications, utilized in a bias condition wherein the source 101, substrate 106, and gate 102 are maintained at ground potential, while the drain region 103 is maintained at or near 200 volts. Such bias conditions are typical in a variety of switching applications relating to medical and communications technology, as well as other technological fields.

Such a device can easily support the 200 volts applied to the drain in an off state with a drift length of approximately 12 micrometers.

Although the configuration of FIG. 1 works well when the device is biased as described, various applications require a different type of biasing. More specifically, in certain switching operations it is necessary to apply a relatively large positive voltage to the drain, and a relatively large negative voltage to the source and gate, while maintaining the substrate voltage at approximately ground. In such configurations, it is typical to bias the source and gate at approximately negative 100 volts, the drain at approximately positive 100 volts, and the substrate layer at approximately 0 volts. This bias condition is referred to as source below substrate potential. Such a condition is employed in a wide variety of circuitry with telephony, medical, and other applications. In such a condition, the substrate is maintained at a voltage between that of the source and drain, rather than the substrate being maintained at a voltage substantially the same as that of the source, as was described with respect to the prior art.

FIG. 3 shows the simulation of the device of FIG. 1 biased in a source below substrate bias condition. Although an attempt is made to bias the source at negative 100 volts and the drain at plus 100 volts, the device can only maintain a maximum difference of approximately 65 volts between the source and drain. The problem is that the breakdown voltage of the device falls from over two hundred volts when it is biased as described with respect to the prior art, to approximately 65 volts when the biasing condition is changed to source below substrate. Accordingly, there exists a need in the art for a thin layer SOI switching device that can operate in the source below bias condition without suffering breakdown at a relatively low voltage.

SUMMARY AND DETAILED DESCRIPTION OF THE INVENTION

In accordance with the invention, the P inversion region in the device is extended to include a "tongue", or extension, which extends into the junction between the buried oxide layer and the silicon on insulator layer. The additional P-type doping that forms the extension or tongue is chosen such that it is depleted by the bias applied to the substrate layer. The depletion of this additional P-type doping means that any bias applied to the drain will deplete n-type charge in the N-Well region 316, shown in FIG. 3. This affect lowers the electric field in the vicinity of the junction between the N-Well region 316 and the P-inversion region 318. By lowering this electric field, the drain voltage can be increased to very near the 200 volts that the device would sustain when biased as described above with respect to the prior art.

Figure 1:
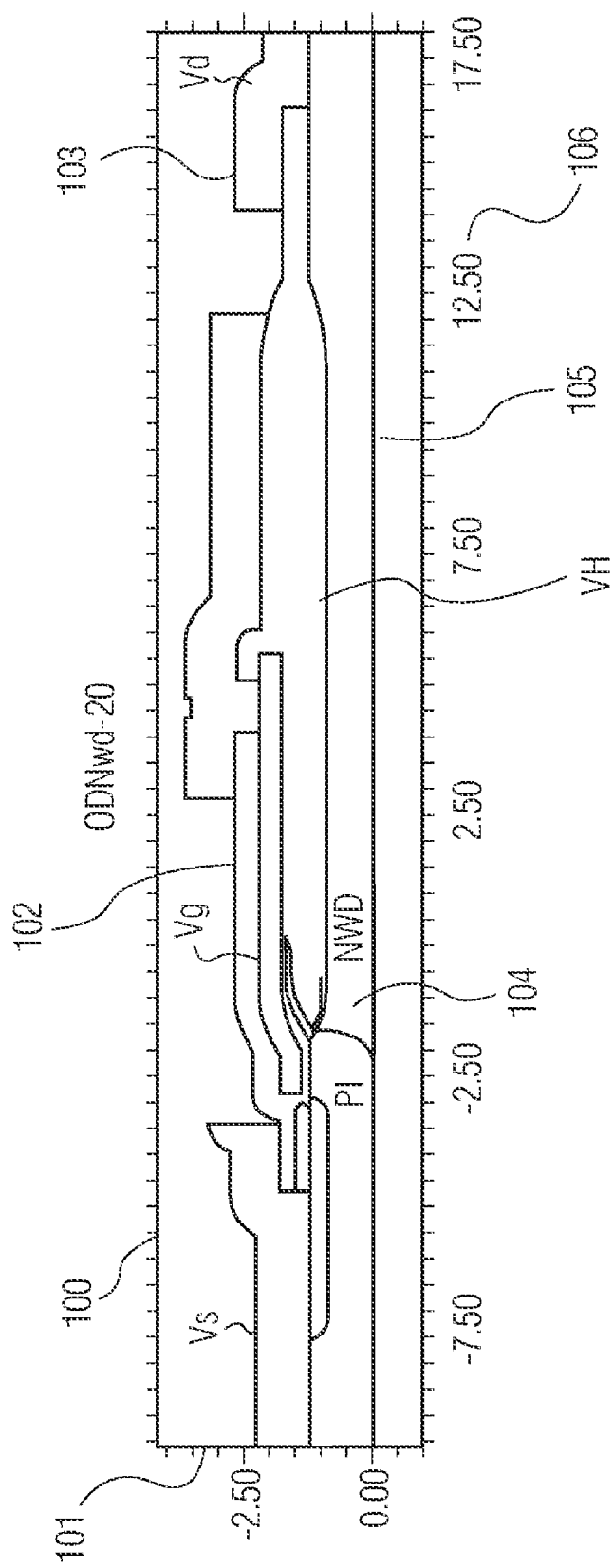
FIG. 1 depicts a prior art silicon on insulator thin layer switching device.
Figure 2:
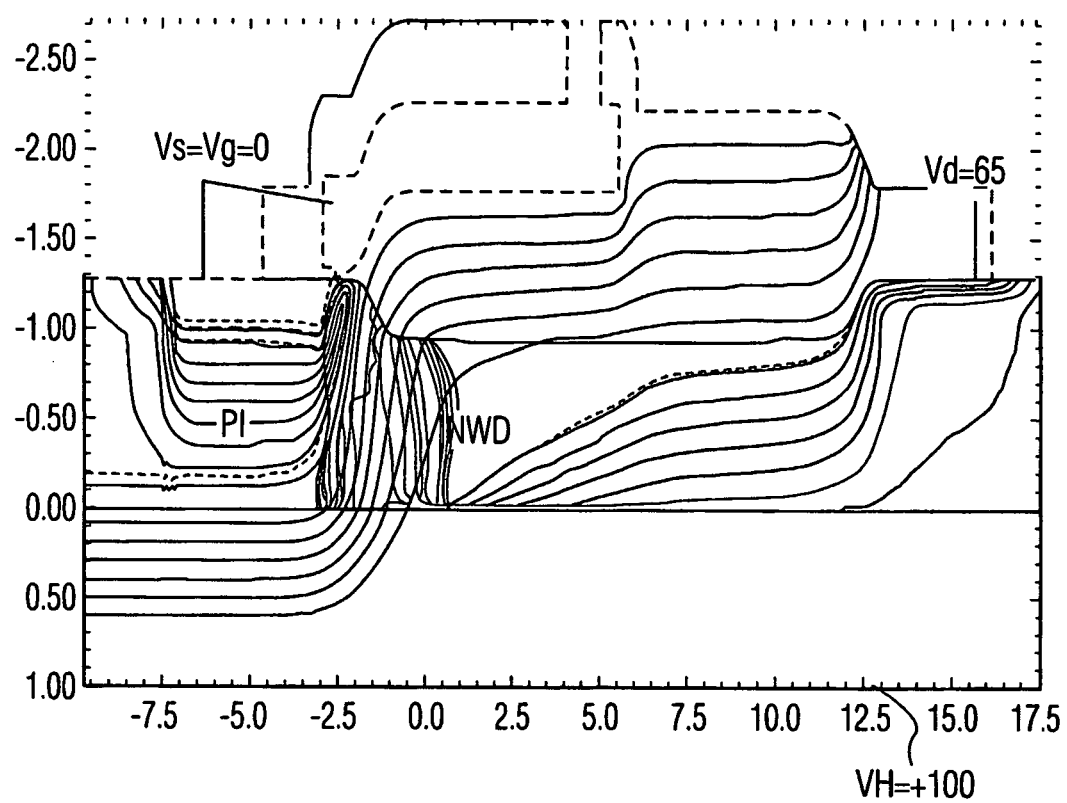
FIG. 2 depicts the electric fields generated within the device of FIG. 1 at particular bias conditions.
Figure 3:
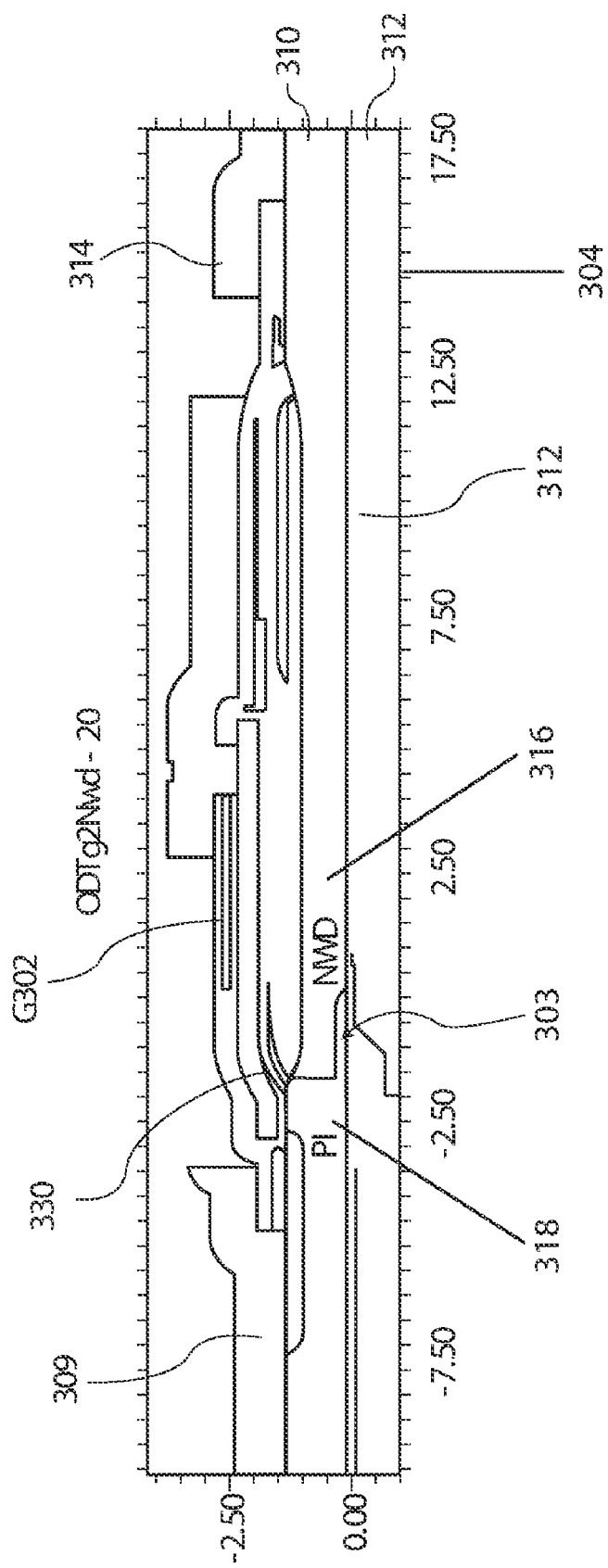
FIG. 3 depicts an exemplary embodiment of the invention.
Figure 4:
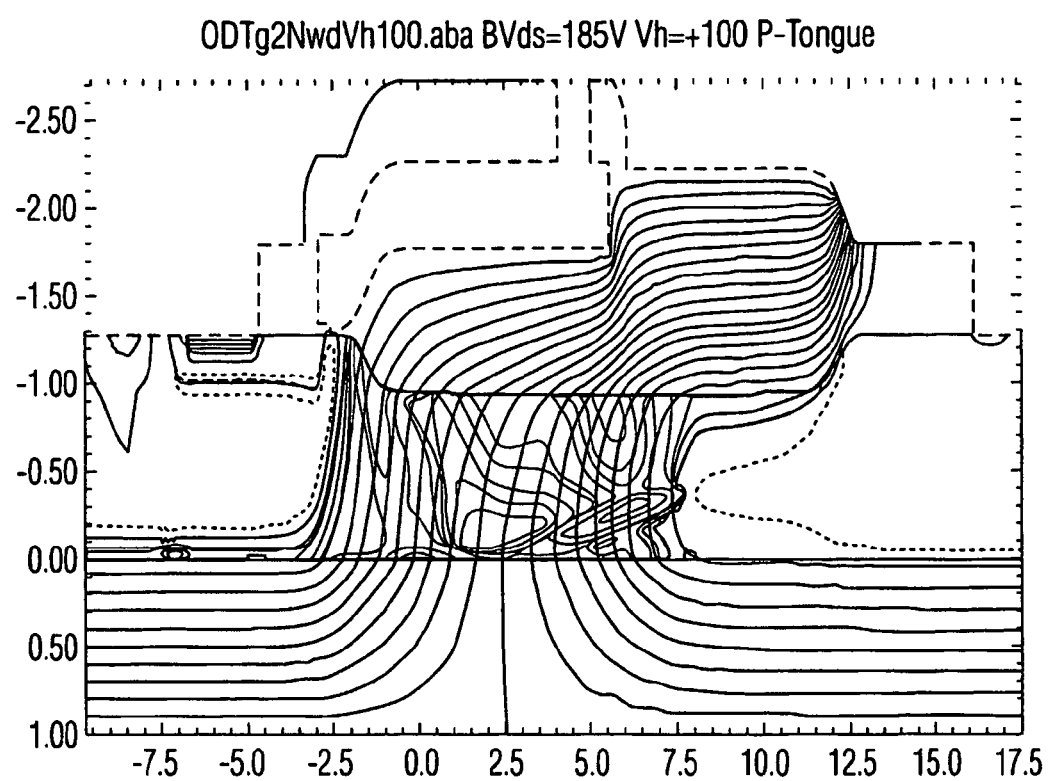
FIG. 4 shows an electric field diagram simulating operation of the device of FIG. 3 in a particular bias condition.

FIG. 3 shows an exemplary embodiment of the present invention including a substrate layer 304, a buried oxide layer 312, an SOI layer 310, source, gate and drain regions 309, 302, and 314, respectively. The N-Well region of the device includes negative charge as indicated at 316 in FIG. 3. Additionally, the P-inversion region 318 is shown having a short extension or a "tongue" 303, which extends into the junction between the buried oxide layer 312 and the SOI layer 310. Although the extension 303 is shown as a tongue shape and is referred to by that term, the invention is not limited to shaping the extension in such a manner, and those of skill in the art will recognize that the additional p-type atoms introduced within extension may be introduced as other shapes, so long as the charge volumes and concentrations are sufficient. Typical charge levels in the tongue region (integrated vertically through the p-type extension) range from 5e11 to 1 e12 cm−2.

In operation according to source below bias condition, the source 309 is biased at, for example, negative 100 volts while the drain 314 would be biased to positive 100 volts. The substrate layer 304 is maintained at approximately ground, leaving 100 volts between the substrate and either the source or drain.

The problem of relatively low breakdown voltages is eliminated by the addition of P-type charge in the small extension or tongue 303. More specifically, the additional charge within the extension region 303 is largely depleted by the bias applied to substrate 304. The positive bias then applied to the drain acts to deplete n-type charge in region 316, just adjacent to the P-inversion/N-Well layer junction, labeled 330. This phenomenon results in a much lower lateral electric field across the junction 330 adjoining P-inversion region 318 with N-Well region 316. The lower electric field means that the drain can be maintained at a higher voltage, thus eliminating the relatively low breakdown voltage for source below substrate bias conditions.

It has been determined empirically that the extension of tongue may be ideally fabricated by using a 1.5 MeV implant of Boron with a fluence of 3e12 cm−2. A photo resist mask is used to properly apply the shape and endpoints of the extension structure, which typically extend 2-3 um past the edge of the PI diffusion region into the drift region. This technique can be integrated with standard diffused channel (LDMOS) process flows or with Latid (large angle tilt implant technology) for PI region formation.

While the above describes the preferred embodiment of the invention, various modifications or additions would be apparent to those of skill in the art. For example, the tongue or extension need not be shaped exactly as shown, but need only provide the sufficient charge so that the bias applied to the substrate layer serves first to deplete that charge, leaving the N-Well charge to be depleted by the drain voltage. Boron need not be used, but any suitable P-type charge can be used to lower the effective lateral electric field in the vicinity of the P-inversion/N-Well junction 330. Rather than the biases given, other biases, such as, for example, 50 volts at the drain and negative 50 at the source, can be used.

What is claimed is:

1. A Silicon on Insulator (SOI) device having an SOI region, a buried oxide region, and a P-Type inversion region, the P-type inversion region forming a first junction with the buried oxide layer and a second junction with the SOI layer, the buried oxide layer forming a third junction with the SOI layer, the P-type inversion region having a tongue that extends into the third junction.

2. The device of claim 1 having a source and drain region and wherein the tongue is closer to the source region than to the drain region.

3. The device of claim 2 further comprising a handler wafer biased at a voltage greater than said source voltage.

4. The device a claim 3 having a gate region, and wherein said gate and said source regions are biased at 50 or more volts less than said handler wafer, and wherein said drain voltage is biased at 50 or more volts greater than said handler wafer.

5. The device of claim 2 wherein said tongue is comprised of Boron atoms.

6. The device of claim 5 wherein said boron atoms are implanted at a concentration of 3e12 atoms/cm$^2$.

7. A silicon on insulator (SOI) device having a an SOI layer, an adjacent buried oxide layer, and an inversion layer, the inversion layer having an extension that extends between the buried oxide layer and the SOI layer.

8. The device of claim 7 wherein the extension is less than 1 micron in thickness.

9. The device of claim 7 wherein the extension comprises P-type doping.

10. The device of claim 9 wherein the extension comprises boron atoms.

11. The device of claim 9 further comprising source, drain, gate, and a wafer handler regions, and a voltage source connected to bias said wafer handler at a voltage less than that at which said drain is biased and greater than that at which said source is biased.

12. The device of claim 11 wherein said drain is biased at a voltage of approximately 200 volts higher than said source.

13. An SOI device comprising an N-Well region, a buried oxide region, and a P-inversion region, the P-inversion region eing extended into a junction between said N-Well region and said buried oxide region, said SOI device having a substrate region biased at a voltage between a bias voltage applied to a source of said device and a bias voltage applied to a drain of said device.

14. The SOI device of claim 13 wherein a portion of the P-inversion region that extends into the junction is doped with charge in an amount such that it is depleted by the bias applied to the substrate layer.

15. A Silicon on Insulator (SOI) device having an SOI region, a buried oxide region, and a P-Type inversion region, the P-type inversion region forming a first junction with the buried oxide layer and a second junction with the SOI layer, the buried oxide layer forming a third junction with the SOI layer, the P-type inversion region having a tongue that extends into the third junction;
  the SOI device further having a source and drain region and wherein the tongue is closer to the source region than to the drain region.

16. The device of claim 15 further comprising a handler wafer biased at a voltage greater than said source voltage.

17. The device a claim 16 having a gate region, and wherein said gate and said source regions are biased at 50 or more volts less than said handler wafer, and wherein said drain voltage is biased at 50 or more volts greater than said handler wafer.

18. The device of claim 15 wherein said tongue is comprised of Boron atoms.

19. The device of claim 18 wherein said boron atoms are implanted at a concentration of 3e12 atoms/cm$^2$.

* * * * *